US005796127A

United States Patent [19]
Hayafuji et al.

[11] Patent Number: 5,796,127
[45] Date of Patent: *Aug. 18, 1998

[54] HIGH ELECTRON MOBILITY TRANSISTOR

[75] Inventors: Norio Hayafuji; Yoshitsugu Yamamoto; Hirotaka Kizuki, all of Tokyo, Japan

[73] Assignee: Mitsubishi Denki Kabushiki Kaisha, Tokyo, Japan

[*] Notice: The term of this patent shall not extend beyond the expiration date of Pat. No. 5,682,045.

[21] Appl. No.: 915,791

[22] Filed: Aug. 21, 1997

Related U.S. Application Data

[63] Continuation of Ser. No. 654,113, May 28, 1996, abandoned.

[30] Foreign Application Priority Data

Nov. 16, 1995 [JP] Japan ................... 7-298117

[51] Int. Cl.$^6$ ................... H01L 29/201; H01L 29/737
[52] U.S. Cl. ................... 257/194; 257/631
[58] Field of Search ................... 257/192, 195, 257/631

[56] References Cited

U.S. PATENT DOCUMENTS

| | | | |
|---|---|---|---|
| 4,246,296 | 1/1981 | Chang | 427/38 |
| 4,828,935 | 5/1989 | Jonker et al. | 257/631 |
| 4,945,065 | 7/1990 | Gregory et al. | 437/4 |
| 5,275,687 | 1/1994 | Choquette et al. | 156/612 |
| 5,682,045 | 10/1997 | Hayafuji et al. | 257/192 |

FOREIGN PATENT DOCUMENTS

| | | | |
|---|---|---|---|
| 452 054 A1 | 10/1991 | European Pat. Off. | 257/194 |
| 0702398 | 3/1996 | European Pat. Off. | |
| 4199518 | 7/1992 | Japan . | |

OTHER PUBLICATIONS

Yoshida et al., "Surface Passivation of $In_{0.52}Al_{0.48}As$ Using $(NH_4)_2S_x$ And $P_2S_5/(NH_4)_2S$", Japanese Journal of Applied Physics, vol. 33, 1994, pp. 1248–1251.

Leclercq et al., "Surface Chemistry Of InAlAs After $(NH_4)_2S_x$ Sulphidation", Semiconductor Science Technology, vol. 10, 1995, pp. 95–100.

Research Disclosure, "A Fluorine Cap For Be Outdiffusion in GaAs", Apr. 1992, No. 336, p. 308, Emsworth, GB.

Hayafuji et al., Thermal Stability of AlInAs/GaInAs/InP heterostructures, Applied Physics Letters, Feb. 13, 1995, vol. 66, pp. 863–865.

Fujita et al., Novel HEMT Structures using a Strained InGaP Schottky Layer, Fifth International Conference on IPRM, Apr. 19–22, 1993, pp. 497–500.

*Primary Examiner*—Jerome Jackson
*Assistant Examiner*—John Guay
*Attorney, Agent, or Firm*—Leydig, Voit & Mayer, Ltd.

[57] ABSTRACT

A method of fabricating a semiconductor device includes forming a first mixed crystal semiconductor layer of AlAs and InAs; applying a solution containing a material easily combining with fluorine to the surface of the first mixed crystal semiconductor layer exposed to the atmosphere so that the material combines with fluorine that sticks to the surface of the first mixed crystal semiconductor layer; and annealing the first mixed crystal semiconductor layer in a vacuum. In this method, since the fluorine on the surface of the first mixed crystal semiconductor layer exposed to the atmosphere combines with the material included in the solution and is removed together with the material, a first mixed crystal semiconductor layer having no fluorine is produced. Therefore, unwanted infiltration of fluorine into the first mixed crystal semiconductor layer is avoided, resulting in a highly reliable semiconductor device with desired characteristics.

4 Claims, 8 Drawing Sheets

$$\frac{Ns}{Nso} = \frac{\text{sheet carrier concentration after heat treatment}}{\text{sheet carrier concentration before heat treatment}}$$

HIGH ELECTRON MOBILITY TRANSISTOR

This disclosure is a continuation of patent application Ser. No. 08/654,113, filed May 28, 1996, now abandoned.

FIELD OF THE INVENTION

The present invention relates to a method of fabricating a semiconductor device with improved reliability, and a semiconductor device fabricated by the method.

BACKGROUND OF THE INVENTION

FIGS. 5(a) and 5(b) were shown in Extended Abstract WC2, pp. 497–500 of Fifth International Conference on Indium Phosphide and Related Materials, held from Apr. 19 to 22, 1993 in Paris, France. FIG. 5(a) is a cross-sectional view illustrating a prior art HEMT (High Electron Mobility Transistor) having an n type InAlAs carrier supply layer on an InP substrate and a Schottky barrier formation layer on the n type InAlAs carrier supply layer. FIG. 5(b) is a graph for explaining degradation of electrical characteristics of the HEMT due to heat.

In FIG. 5(a), reference numeral 101 designates a semi-insulating InP substrate. An undoped InP layer 102 about 10 nm thick is disposed on the InP substrate 101. An undoped InGaAs channel layer 103 about 20 nm thick is disposed on the undoped InP layer 102. An undoped InAlAs spacer layer 104 about 3 nm thick is disposed on the channel layer 103. An n$^+$ type InAlAs electron supply layer 105 about 15 nm thick and having a dopant impurity concentration of $3 \times 10^{18}$ cm$^{-3}$ is disposed on the spacer layer 104. A Schottky barrier formation layer 106 about 10 nm thick is disposed on the electron supply layer 105. Preferably, the Schottky barrier formation layer comprises undoped In$_{0.75}$Ga$_{0.25}$P. An n$^+$ type InGaAs ohmic contact layer 107 about 20 nm thick and having a dopant impurity concentration of $5 \times 10^{18}$ cm$^{-3}$ is disposed on the Schottky barrier formation layer 106. The ohmic contact layer 107 has an opening in which the Schottky barrier formation layer 106 is exposed. A gate electrode 110 is disposed on a portion of the Schottky barrier formation layer 106 in the opening of the ohmic contact layer 107. A source electrode 108 and a drain electrode 109 are disposed on the ohmic contact layer 107.

In FIG. 5(b), the abscissa shows heat treatment temperature (° C.), and the ordinate shows sheet carrier concentration ($\times 10^{12}$cm$^{-2}$) of a two-dimensional electron gas produced at the interface of the undoped InGaAs channel layer 103 and the undoped InAlAs spacer layer 104. In the figure, circles, triangles, and squares represent cases where the Schottky barrier formation layer 106 comprises In$_{0.75}$Ga$_{0.25}$P, InP, and InAlAs, respectively.

A description is given of degradation of electrical characteristics of a HEMT due to heat. In the cited publication, Fujita et al., examined stabilities of HEMTs against heat. First of all, they prepared three different semiconductor layer structures, each comprising an undoped InP layer 102, an undoped InGaAs channel layer 103, an undoped InAlAs spacer layer 104, an n$^+$ type InAlAs electron supply layer 105, and a Schottky barrier formation layer 106 comprising any one material selected from the group consisting of In$_{0.75}$Ga$_{0.25}$P, InP, and InAlAs, which layers are grown in this order on a semi-insulating InP substrate 101. These semiconductor layer structures are similar to the layer structure of the HEMT shown in FIG. 5(a). Then, the semiconductor layer structures were heat-treated for five minutes at temperatures of 300° C. and 350° in a nitrogen ambient, and sheet carrier concentrations of the two-dimensional electron gas produced at the interface of the undoped InGaAs channel layer 103 and the undoped InAlAs spacer layer 104 were measured. The results are illustrated in FIG. 5(b). As shown in the figure, regardless of the material of the Schottky barrier formation layer 106, the sheet carrier concentrations decrease after the heat treatment at a temperature of 300° C. or above.

These results indicate that, if a heat treatment at a temperature of 300° C. or above is carried out, the electrical characteristics of the HEMT are degraded by heat and a desired sheet carrier concentration cannot be obtained. As a result, the resistance of the region where the two-dimensional electron gas is produced unfavorably increases and the expected HEMT characteristics cannot be obtained. Concerning this phenomenon, Fujita et al. commented that this decrease in the surface sheet carrier concentration was due to an increase of a surface depletion layer caused by surface degradation of the InAlAs layer.

The inventors of the present invention have studied the degradation of electrical characteristics of an HEMT due to heat. FIG. 6 is a cross-sectional view illustrating a semiconductor layer structure used in the study by the inventors of the present invention, and FIG. 7 illustrates the result obtained from the study. In FIG. 6, reference numeral 111 designates a semi-insulating InP substrate. An intrinsic (hereinafter referred to as i type) AlInAs buffer layer 112 2500 Å thick is disposed on the substrate 111. An i type InGaAs channel layer 113 500 Å thick is disposed on the buffer layer 112. An AlInAs carrier supply layer 114 340 Å thick is disposed on the channel layer 113. In the AlInAs carrier supply layer 114, planar doping with Si is present at a 20 Å spacing from the channel layer 113. A part of the carrier supply layer 114 from the channel layer 113 to the Si planar doping is designated as a spacer layer 115. A two-dimensional electron gas 116 is produced in the channel layer 113 at the interface of the channel layer 113 and the electron supply layer 114.

In FIG. 7, the abscissa shows heat treatment temperature (° C.) and the ordinate shows a ratio of sheet carrier concentration N$_S$ after the heat treatment to sheet carrier concentration N$_{SO}$ before the heat treatment, i.e., N$_S$/N$_{SO}$.

This study was carried out as follows. The semiconductor layer structure shown in FIG. 6 was heat-treated for fifteen minutes at different temperatures in a nitrogen ambient, and the sheet carrier concentration of the two-dimensional electron gas 116 produced at the interface of the i type GaInAs channel layer 113 and the InAlAs electron supply layer 114 is measured by a Hall measurement. As shown in FIG. 7, even in this semiconductor layer structure, the sheet carrier concentration is reduced by the heat treatment, resulting in a HEMT with degraded electrical characteristics.

A study in search for causes of the degradation of electrical characteristics of the prior art semiconductor device due to heat was carried out by the inventors of the present invention, and the result is described in Applied Physics Letters, Vol. 66, No. 7, Feb. 13, 1995, pp. 863–865. FIG. 8 is a cross-sectional view of a semiconductor layer structure used in this study. In the figure, reference numeral 21 designates a semi-insulating InP substrate, numeral 22 designates an i type AlInAs layer about 4000 Å thick, and numeral 23 designates an Si-doped AlInAs layer about 1300 Å thick.

This study was carried out as follows. Initially, the semiconductor layer structure as shown in FIG. 8 was fabricated by growing the i type AlInAs layer 22 and the Si-doped AlInAs layer 23 successively on the semi-insulating InP substrate 21 in an MBE (Molecular Beam Epitaxy) chamber. Then, the semiconductor layer structure was taken out of the chamber and heat-treated for fifteen minutes in a nitrogen ambient at different temperatures, for example, 300° C., 400° C., and 450° C. Thereafter, an impurity analysis of the semiconductor layer structure was made by SIMS (Secondary Ion Mass Spectroscopy). The result of the impurity analysis is shown in FIG. 9.

In FIG. 9, the abscissa shows a distance (μm) from the surface of the semiconductor layer structure, and the ordinate shows atomic concentration ($cm^{-3}$) of fluorine. In the figure, white circles represent a fluorine profile (distribution) of the semiconductor layer structure before the heat treatment, and white squares, white triangles, and black squares represent fluorine profiles after heat treatment temperatures of 300° C., 400° C., and 450° C., respectively.

From the study, the following facts are ascertained. First, $^{19}F$ (fluorine) infiltrates the semiconductor layer structure due to the heat treatment. Secondly, the amount of $^{19}F$ increases with an increase in the heat treatment temperature. Thirdly, the infiltration of $^{19}F$ is prominent in the Si-doped layer. Finally, $^{19}F$ accumulates at the interface of the epitaxial layer and the substrate as well. The first fact is based on the result obtained by detection of atoms of mass number 19, checking impurities over the entire mass range during the SIMS measurement.

From the first to fourth facts, a new fact that fluorine ($^{19}F$) infiltrates the semiconductor layer structure due to heat treatment, which has not previously been known, was ascertained. Since fluorine was not detected at all from materials except the Si-doped AlInAs layer 23, it was considered that the infiltration of fluorine was characteristic only to the Si-doped AlInAs layer 23. The infiltration route of fluorine was investigated, but fluorine was not used in the MBE chamber for the growth of the semiconductor layer structure, and fluorine was not actively supplied inside the laboratory. When the uppermost surface of the Si-doped AlInAs layer 23, right after growth, was analyzed by ESCA (Electron Spectroscopy for Chemical Analysis), about 0.3 atomic % of fluorine was detected. From this fact, it was considered that fluorine resulted from hydrofluoric acid (HF) or the like used in other semiconductor fabricating processes and remaining in the air inside the laboratory. This minute amount of fluorine remaining in the air, when the uppermost surface of the Si-doped AlInAs layer 23 was exposed to the atmosphere, was attracted to and stuck to the surface and, finally, it infiltrated the AlInAs layer 23.

Together with the analysis of fluorine, although not shown in the figure, changes of profiles before and after the heat treatment were investigated for elements other than fluorine, such as nitrogen, and the results were that almost the same profiles were obtained before and after the heat treatment.

As described above, since fluorine in the atmosphere sticks to the surface of the Si-doped AlInAs layer 23 and infiltrates the Si-doped AlInAs layer 23 due to the heat treatment and the change in profile due to the heat treatment is not observed for elements other than fluorine, it is considered that the degradation of electrical characteristics of a semiconductor device is caused by the infiltration of fluorine as a result of the heat treatment.

In order to prevent the degradation of electrical characteristics caused by the infiltration of fluorine, one of the choices is to remove fluorine entirely from the atmosphere. However, fluorine in the atmosphere in a plant where semiconductor devices are fabricated cannot usually be removed completely. Since complete removal of fluorine would be very difficult, the infiltration of fluorine into a semiconductor device cannot be prevented.

Therefore, as long as fluorine in the atmosphere infiltrates through the surface of the impurity-doped AlInAs layer which is exposed to the atmosphere due to the heat treatment, the degradation of electrical characteristics of the semiconductor device including the impurity-doped AlInAs layer due to the heat treatment cannot be avoided.

As described above, in a semiconductor device including an impurity-doped InAlAs layer, such as the prior art HEMT, when the InAlAs layer is exposed to the atmospheric ambient and, thereafter, heat treatment is carried out, fluorine sticks to the surface of the AlInAs layer exposed to the atmosphere and infiltrates the InAlAs layer during the heat treatment, resulting in degradation of electrical characteristics of the device, such as a reduction in the sheet carrier concentration. In a reliability test of a semiconductor device, usually, the device is operated under a high temperature environment in which the characteristics of the device are likely to be degraded and, thereafter, changes of the characteristics with a lapse of time are detected. However, in the reliability test including the heat treatment, since the sheet carrier concentration is decreased as described above, satisfactory results cannot be obtained. As a result, a highly reliable semiconductor device cannot be realized.

Furthermore, since the electrical characteristics of the prior art semiconductor device are degraded by heat, it is very difficult to operate the semiconductor device at a high temperature for a long period of time while maintaining desired characteristics. It is also difficult to provide a semiconductor device having high reliability during the high temperature operation.

Furthermore, when the impurity-doped InAlAs layer is subjected to a heat treatment at a high temperature, since the electrical characteristics of the impurity-doped InAlAs layer are degraded by infiltration of fluorine due to the heat treatment, a semiconductor device with desired characteristics cannot be obtained. For example, in a HEMT including an impurity-doped InAlAs layer as a carrier supply layer, such infiltration of fluorine causes a reduction in the sheet carrier concentration of the two-dimensional electron gas, whereby desired operating characteristics cannot be obtained.

SUMMARY OF THE INVENTION

It is an object of the present invention to provide a method of fabricating a highly reliable semiconductor device with desired electrical characteristics.

It is another object of the present invention to provide a highly reliable semiconductor device with desired electrical characteristics.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a method of fabricating a semiconductor device comprises forming a first mixed crystal semiconductor layer comprising AlAs and InAs; applying a solution containing a material that is easily combined with fluorine to the surface of the first mixed crystal semiconductor layer exposed to the atmosphere so that the material contained in the solution combines with fluorine that sticks to the surface of the first mixed crystal semiconductor layer; and annealing the first mixed crystal semiconductor layer in a vacuum at a high temperature. In this method, since the fluorine on the surface of the first mixed crystal semiconductor layer exposed to the atmosphere is combined with the material included in the solution and removed together with the material, a first mixed crystal semiconductor layer having no fluorine is produced. Therefore, unwanted infiltration of fluorine into the first mixed crystal semiconductor layer is avoided, resulting in a highly reliable semiconductor device with desired characteristics.

According to a second aspect of the present invention, the method further includes growing a second mixed crystal semiconductor layer comprising AlAs and InAs and doped with an impurity; and growing the first mixed crystal semiconductor layer containing no dopant impurity on the second mixed crystal semiconductor layer. Also in this case, since infiltration of fluorine into the impurity-doped second mixed crystal semiconductor layer is avoided, a highly reliable semiconductor device with desired characteristics is realized.

According to a third aspect of the present invention, the method further includes, subsequently to the annealing, forming a protective film on the surface of the first mixed crystal semiconductor layer in a vacuum. Since the protective film prevents fluorine from sticking to the surface of the first mixed crystal semiconductor layer, unwanted infiltration of fluorine into the first mixed crystal semiconductor layer is avoided, whereby a highly reliable semiconductor device with desired characteristics is obtained.

According to a fourth aspect of the present invention, a method of fabricating a semiconductor device comprises preparing a compound semiconductor substrate having a surface; successively growing on the surface of the compound semiconductor substrate, a channel layer comprising an undoped compound semiconductor material, an electron supply layer comprising a mixed crystal semiconductor material comprising AlAs and InAs and highly doped with an n type producing dopant, a Schottky barrier formation layer comprising an undoped mixed crystal semiconductor material comprising AlAs and InAs, and an ohmic contact layer comprising a compound semiconductor material highly doped with an n type producing dopant; forming a source electrode and a drain electrode on the ohmic contact layer; forming a recess by etching a portion of the ohmic contact layer between the source electrode and the drain electrode so that part of the Schottky barrier formation layer is exposed; forming a gate electrode on a central portion of the Schottky barrier formation layer exposed in the recess; applying a solution containing a material that is easily combined with fluorine to the surface of the Schottky barrier formation layer in the recess, where the gate electrode is not present, to combine the material contained in the solution with fluorine that sticks to the surface of the Schottky barrier formation layer in the recess; annealing the substrate and the semiconductor layers on the substrate in a vacuum at a high temperature; and, subsequently to the annealing, in a vacuum, forming a protective film on the surface of the Schottky barrier formation layer exposed in the recess. In this method, since the fluorine on the surface of the Schottky barrier formation layer exposed to the atmosphere is combined with the material included in the solution and removed together with the material, unwanted infiltration of fluorine into the Schottky barrier formation layer is avoided. In addition, since the protective film is formed on the Schottky barrier formation layer, no more fluorine sticks to this layer. Therefore, a Schottky barrier formation layer having no fluorine is obtained, resulting in a highly reliable semiconductor device with desired characteristics.

According to a fifth aspect of the present invention, a semiconductor device includes a mixed crystal semiconductor layer comprising AlAs and InAs and having no fluorine. In this device, since the mixed crystal semiconductor layer does not contain fluorine that degrades the electrical characteristics, desired electrical characteristics are obtained. In addition, since no fluorine exists on the surface of the mixed crystal semiconductor layer, unwanted infiltration of fluorine due to heat during the operation is avoided. As a result, a highly reliable semiconductor device with desired characteristics is realized.

According to a sixth aspect of the present invention, a semiconductor device comprises a compound semiconductor substrate; an undoped channel layer disposed on the substrate; an electron supply layer disposed on the channel layer, comprising a mixed crystal semiconductor material comprising AlAs and InAs, having a high concentration of an n type producing dopant, and having no fluorine; a Schottky barrier formation layer disposed on the electron supply layer, comprising an undoped mixed crystal semiconductor material comprising AlAs and InAs, and having no fluorine; an ohmic contact layer disposed on the Schottky barrier formation layer and having a high concentration of an n type producing dopant; a source electrode and a drain electrode disposed on the ohmic contact layer; a gate electrode disposed on a portion of the Schottky barrier formation layer between the source electrode and the drain electrode; and a protective film disposed on a portion of the Schottky barrier formation layer adjacent to the gate electrode and between the source electrode and the drain electrode. In this device, since the Schottky barrier formation layer and the electron supply layer contain no fluorine that degrades the electrical characteristics, desired electrical characteristics are obtained. In addition, since no fluorine exists on the Schottky barrier formation layer, unwanted infiltration of fluorine due to heat during the operation is avoided. Further, since the Schottky barrier formation layer is covered with the protective film, the surface of this layer is protected from fluorine. As a result, a highly reliable semiconductor device with desired characteristics is realized.

DETAILED DESCRIPTION OF THE PREFERRED EMBODIMENTS

Figure 1:
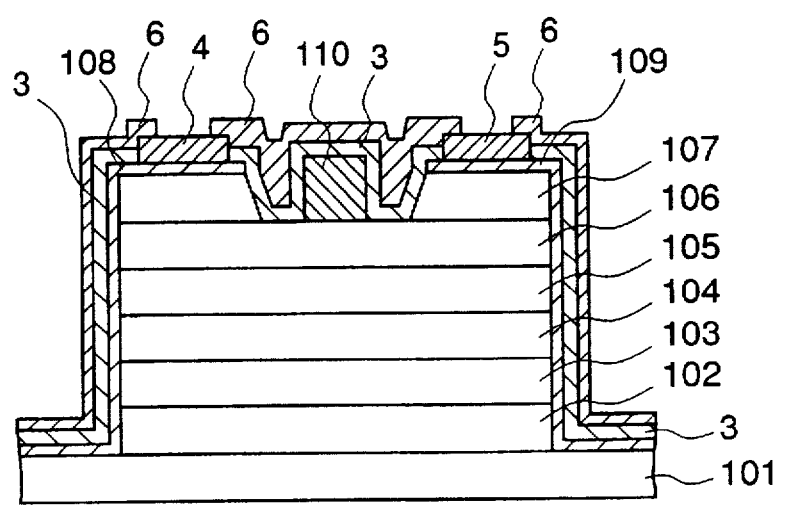
FIG. 1 is a cross-sectional view illustrating an HEMT in accordance with the present invention.

FIG. 1 is a cross-sectional view illustrating an HEMT in accordance with the present invention. This HEMT includes a semi-insulating InP substrate 101. An undoped InP layer 102 about 10 nm thick is disposed on the substrate 101. An undoped InGaAs channel layer 103 about 20 nm thick is disposed on the undoped InP layer 102. An undoped InAlAs spacer layer 104 about 3 nm thick is disposed on the channel layer 103. An $n^+$ type InAlAs electron supply layer 105 about 15 nm thick and having a dopant impurity concentration of $3 \times 10^{18}$ cm$^{-3}$ is disposed on the spacer layer 104. A Schottky barrier formation layer 106 about 10 nm thick is disposed on the electron supply layer 105. Preferably, the Schottky barrier formation layer 106 comprises $In_{0.75}Ga_{0.25}P$. An $n^+$ type InGaAs ohmic contact layer 107 about 20 nm thick and having a dopant impurity concentration of $5 \times 10^{18}$ cm$^{-3}$ is disposed on the Schottky barrier formation layer 106. The ohmic contact layer 107 has an opening in which a part of the Schottky barrier formation layer 106 is exposed. A gate electrode 110 is disposed on the Schottky barrier formation layer 106 in the opening of the ohmic contact layer 107. A source electrode 108 and a drain electrode 109 are disposed on the ohmic contact layer 107. Wiring metal layers for 4 and 5 are disposed on the source electrode 108 and the drain electrode 109, respectively. The entire structure, except the upper surfaces of the wiring metal layers 4 and 5, is covered with a first protective film 3 comprising SiON and a second protective film 6 comprising SiN.

FIGS. 2(a)–2(i) are cross-sectional views illustrating process steps in a method of fabricating the HEMT shown in FIG. 1. In the figures, the same reference numerals as those shown in FIG. 1 designate the same or corresponding parts. Reference numeral 1 designates a solution of ammonium sulfide or ammonium polysulfide, numeral 2 designates a remainder of the solution 1, and numeral 7 designates a beaker.

A description is given of the method of fabricating the HEMT according to the present invention.

Figure 2:
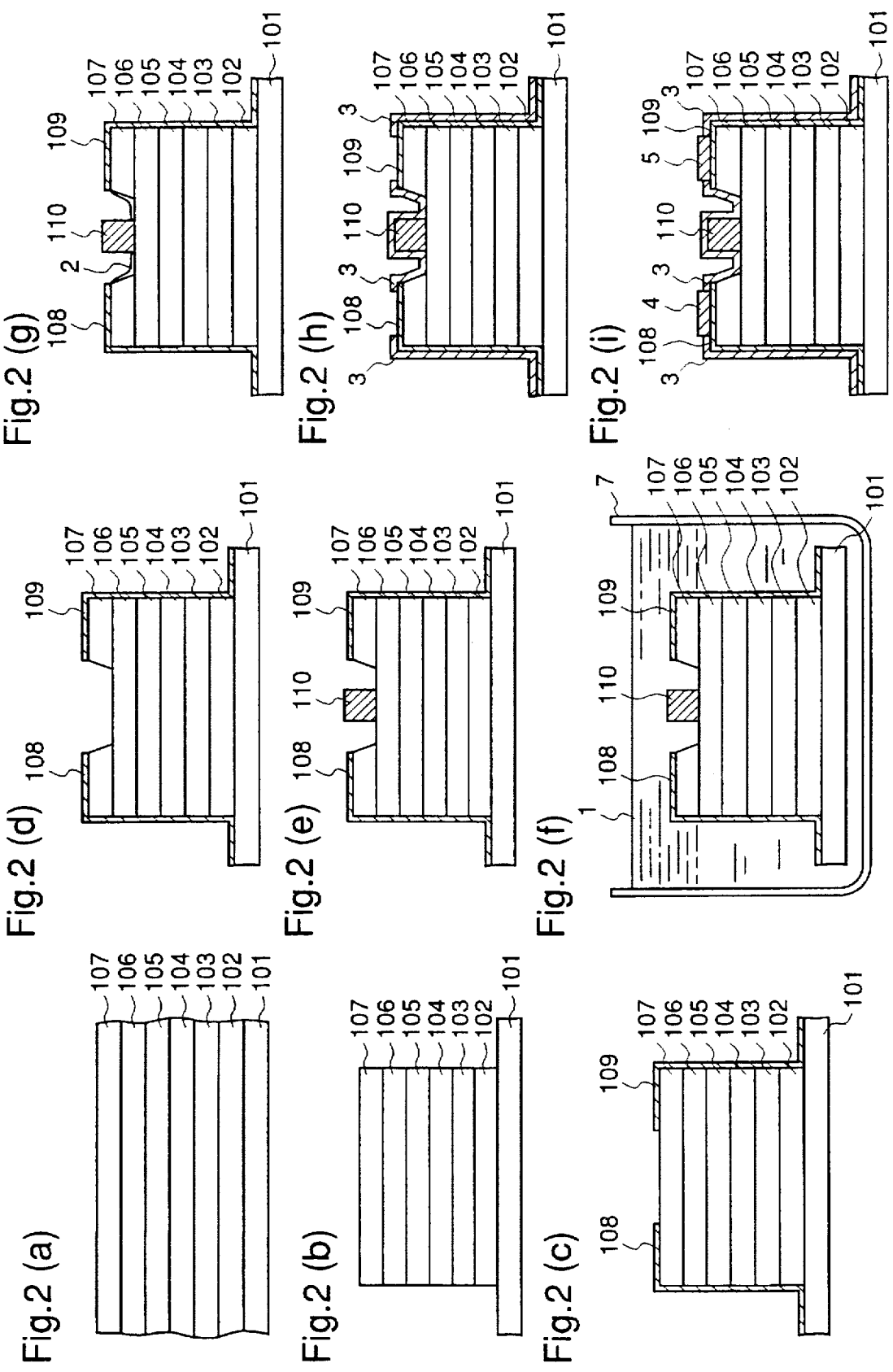
FIGS. 2(a)-2(i) are cross-sectional views illustrating process steps in a method for fabricating the HEMT shown in FIG. 1.

Initially, as illustrated in FIG. 2(a), there are successively grown on the semi-insulating InP substrate 101 the undoped InP layer 102, the undoped InGaAs channel layer 103, the undoped InAlAs spacer layer 104, the $n^+$ type InAlAs electron supply layer 105, the undoped InAlAs Schottky barrier formation layer 106, and the $n^+$ type InGaAs ohmic contact layer 107. Preferably, these layers are grown by MBE or MOCVD. Hereinafter, this structure is called a wafer.

Thereafter, an insulating film (not shown), such as SiN or SiON, is deposited on the wafer by sputtering or plasma-CVD and patterned by an etching technique using hydrofluoric acid. Using the insulating film as a mask, the wafer is etched with a mixture of tartaric acid, hydrogen peroxide, and water from the surface of the ohmic contact layer 107 to the surface of the substrate 101, thereby producing a mesa structure for an HEMT (FIG. 2(b)). After removal of the insulating film, the source electrode 108 and the drain electrode 109 are produced by vacuum deposition of Au or AuGe/Ni/Au.

In an atmospheric ambient, a portion of the $n^+$ type InGaAs ohmic contact layer 107 is etched and removed with a mixture of citric acid, hydrogen peroxide, and water or a mixture of tartaric acid, hydrogen peroxide, and water, producing a recess (FIG. 2(d)). In this etching process, a portion of the undoped InAlAs Schottky barrier formation layer 106 may be etched at the surface. Since the wafer is exposed to the atmosphere, fluorine sticks to the surface of the undoped InAlAs Schottky barrier formation layer 106 exposed in the recess.

In the step of FIG. 2(e), the gate electrode 110 is formed on the InAlAs Schottky barrier formation layer 106 in the recess by the evaporation and lift-off technique using a resist. Preferably, Ti/Mo or Al based material is employed for the gate electrode 110.

Thereafter, a beaker 7 filled with ammonium sulfide (($NH_4)_2S$) or ammonium polysulfide (($NH_4)_2S_x$) is prepared. The wafer is immersed in the solution at the room temperature for more than several seconds, preferably for five minutes (FIG. 2(f)).

Then, the wafer is taken out from the solution and washed with demineralized water for about ten minutes (FIG. 2(g)). A very small amount of ($NH_4)_2S$ or ($NH_4)_2S_x$ 2 remains on the surface of the undoped InAlAs Schottky barrier formation layer 106 exposed to the atmosphere.

Thereafter, the wafer is put in a plasma CVD furnace, and vacuum annealed at about 300° C. for about fifteen minutes, followed by plasma CVD of SiON to form a protective film 3 (FIG. 2(h)). Although a temperature higher than 50° C. is sufficient for the vacuum annealing, since the annealing time is increased with a decrease in the annealing temperature, it is desired that the annealing is carried out at a temperature higher than 200° C.

After the vacuum annealing, portions of the protective film 3 opposite the source and drain electrodes 108 and 109 are etched and removed to form openings, and the wiring metal layers 4 and 5 comprising Au are formed in the openings by the evaporation and lift-off technique (FIG. 2(i)). Finally, a protective film 6 comprising SiN is formed on the entire surface of the wafer, and portions of the protective film 6 are etched and removed to form openings for leads to the source, drain, and gate electrodes, completing the HEMT shown in FIG. 1.

Figure 3:
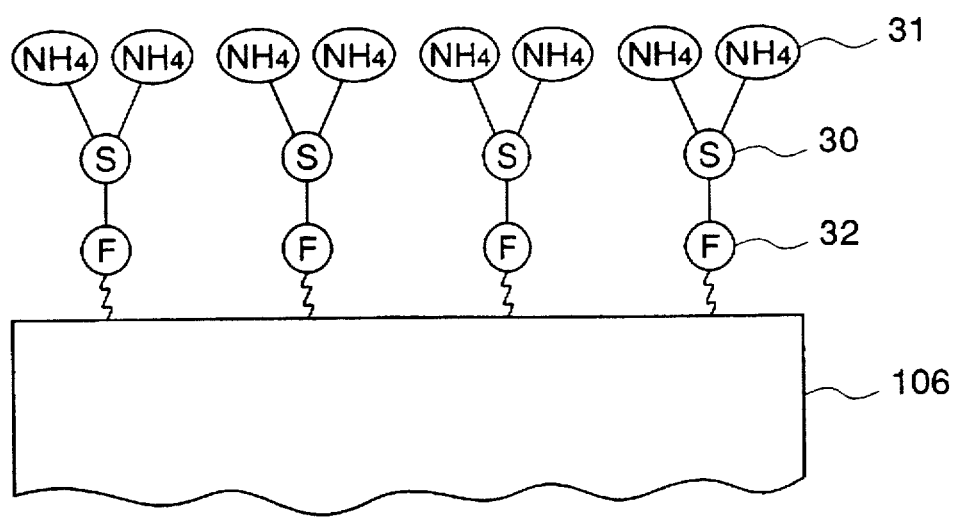
FIGS. 3(a) and 3(b) are schematic diagrams for explaining removal of fluorine in the fabrication method according to the present invention.
Figure 3:
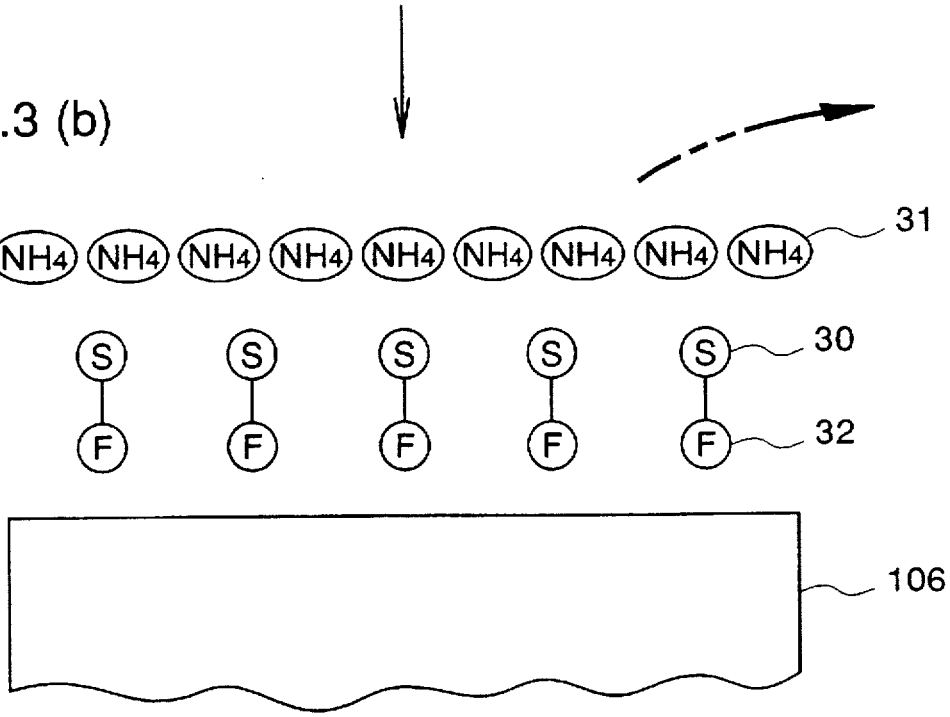

The surface condition of the undoped InAlAs Schottky barrier formation layer 106 in the steps of FIGS. 2(f) and 2(h) is schematically shown in FIGS. 3(a) and 3(b), respectively. More specifically, FIG. 3(a) shows the surface of the Schottky barrier formation layer 106 immediately after the immersion of the wafer in ($NH_4)_2S$ or ($NH_4)_2S_x$ (FIG. 2(f)), and FIG. 3(b) shows the surface of the Schottky barrier formation layer 106 immediately after the vacuum annealing of the wafer (FIG. 2(h)). In these figures, reference numeral 30 designate sulfur (S), numeral 31 designates ammonium radical ($NH_4$), and numeral 32 designates fluorine (F).

As shown in FIG. 3(a), when the wafer is immersed in ($NH_4)_2S$ or ($NH_4)_2S_x$, fluorine (F) 32 sticking to the surface of the undoped InAlAs Schottky barrier formation layer 106 combines with sulfur (S) in $(NH_4)_2S$ or $(NH_4)_2S_x$, whereby the bonding strength between the fluorine 32 and the undoped InAlAs Schottky barrier formation layer 106 is reduced. As shown in FIG. 3(b), in the vacuum annealing, the fluorine 32 is separated from the surface of the wafer and exhausted from the vacuum furnace.

Figure 4:
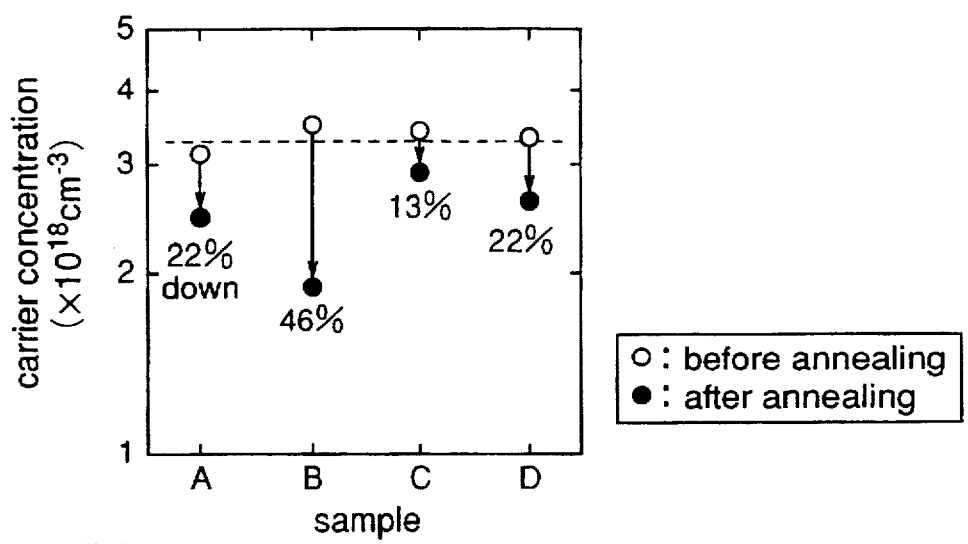
FIGS. 4(a)-4(c) are diagrams showing a result of an experiment for explaining effects of the fabrication method according to the present invention.
Figure 4:
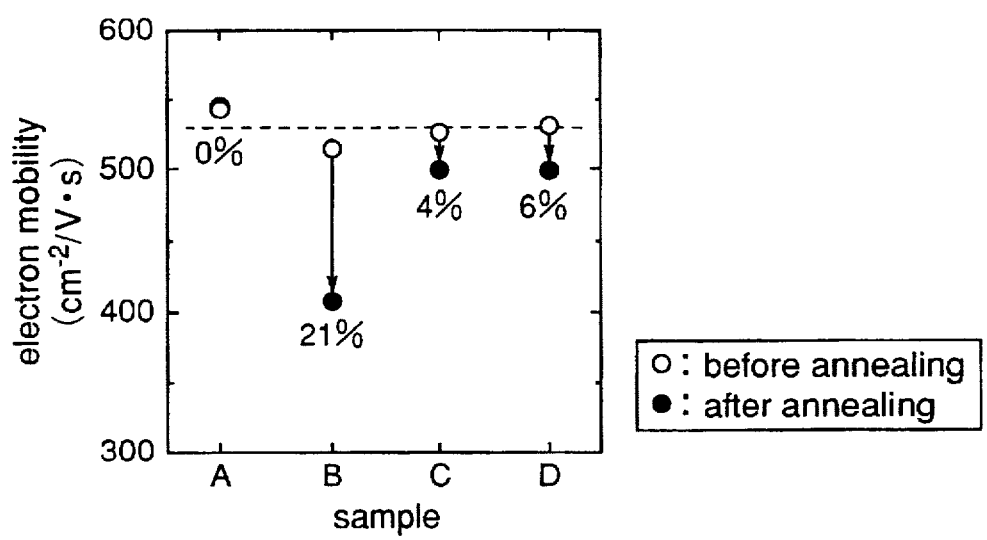
Figure 4:
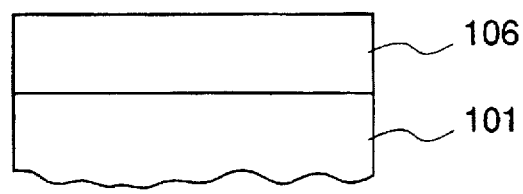

The physical basis of the separation of fluorine from the surface of the wafer was made clear in the following examination. The examination will be described using FIGS. 4(a)–4(c). FIG. 4(c) shows a sample used for the examination. The sample comprises a semi-insulating InP substrate 101 and an undoped InAlAs layer 106 grown on the substrate 101. First of all, four samples A, B, C, and D are prepared by giving different treatments to the sample shown in FIG. 4(c). No treatment is applied to the sample A. The treatment for the sample B comprises immersing the sample shown in FIG. 4(c) in undiluted HF (hereinafter referred to simply as HF) for one second, washing the sample, and leaving the sample in the atmosphere so that a large quantity of fluorine is attracted to the surface. The treatment for the sample C comprises immersing the sample shown in FIG. 4(c) in HF for one second, washing the sample, immersing the sample in $(NH_4)_2S$ for five minutes, and washing the sample. The treatment for the sample D comprises immersing the sample shown in FIG. 4(c) in HF for one second, washing the sample, immersing the sample in $(NH_4)_2S_x$ for five minutes, and washing the sample. These samples A, B, C, and D are annealed in a vacuum of 0.015 Torr at 450° C. for fifteen minutes. FIGS. 4(a) and 4(b) are graphs showing results of Hall measurements at room temperature before and after the annealing. FIG. 4(a) shows variations in the carrier concentrations of the respective samples, and FIG. 4(b) shows variations in the electron mobilities of the respective samples. In the figures, white circles represent a state before the vacuum annealing and black circles represent a state after the vacuum annealing. Further, the ordinate in FIG. 4(a) is logarithmic.

As shown in FIGS. 4(a) and 4(b), reductions in the carrier concentrations and the electron mobilities in the samples C and D which were immersed in $(NH_4)_2S$ and $(NH_4)_2S_x$ after the HF treatment are smaller than those in the sample B which was not treated with $(NH_4)_2S$ and equivalent to those in the sample A which was not pretreated at all. From this result, it is found that the treatment with $(NH_4)_2S$ or $(NH_4)_2S_x$ recovers the carrier concentration and the electron mobility which are likely to decrease after the HF treatment as seen from the result of the sample B. This result is attributed to the fact that fluorine (F) sticking to the surface of the AlInAs layer combines with sulfur (S) in $(NH_4)_2S$ or $(NH_4)_2S_x$. As the result of the S-F combination, the bonding strength between the fluorine and the AlInAs layer is reduced, and the fluorine is separated from the surface in the vacuum annealing and exhausted from the vacuum furnace.

When samples similar to those described above are annealed in an $N_2$ gas ambient, the effect by the $(NH_4)_2S$ or $(NH_4)_2S_x$ treatment is not obtained. The carrier concentrations and the electron mobilities of the samples C and D are reduced as in the sample B.

As described above, in the method of fabricating an HEMT according to the present invention, although the undoped InAlAs Schottky barrier formation layer 106 is exposed to the atmosphere by the recess etching and fluorine sticks to the surface of this layer, since the wafer is immersed in $(NH_4)_2S$ or $(NH_4)_2S_x$ and annealed in a vacuum at a high temperature, the fluorine is completely removed. Further, subsequent to the vacuum annealing, the protective film 3 is formed on the undoped InAlAs Schottky barrier formation layer 106 to protect the surface of this layer from fluorine.

Figure 5:
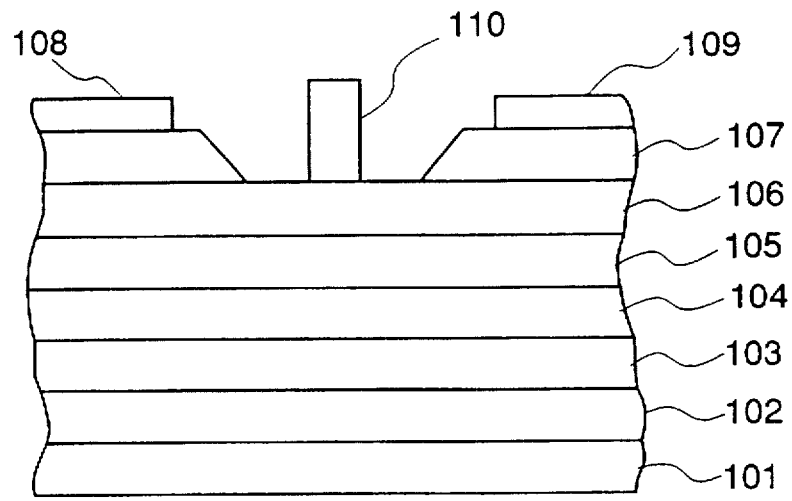
FIG. 5(a) is a cross-sectional view illustrating an HEMT according to the prior art.
FIG. 5(b) is a graph showing degradation of electrical characteristics of the HEMT due to heat treatment.
Figure 5:
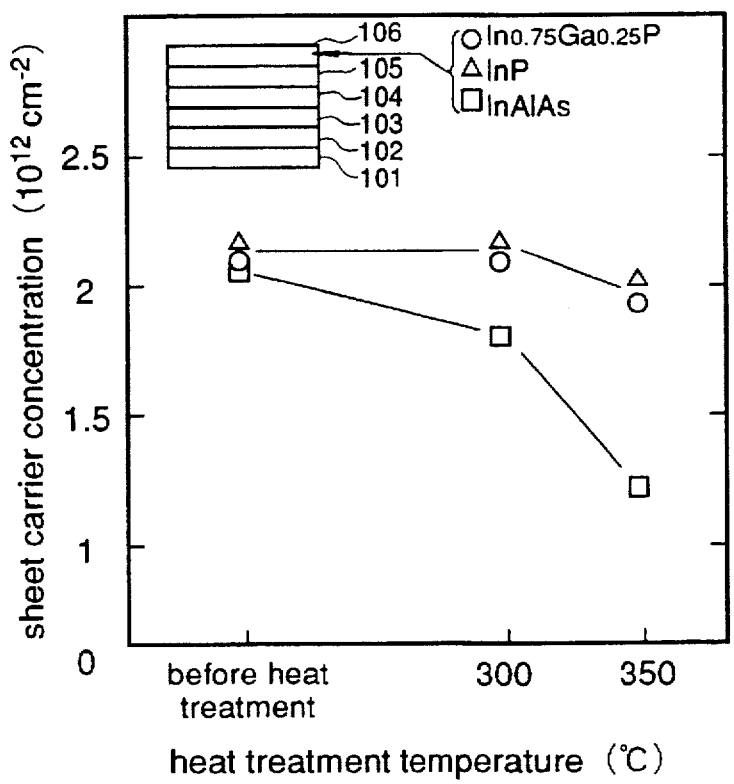
Figure 6:
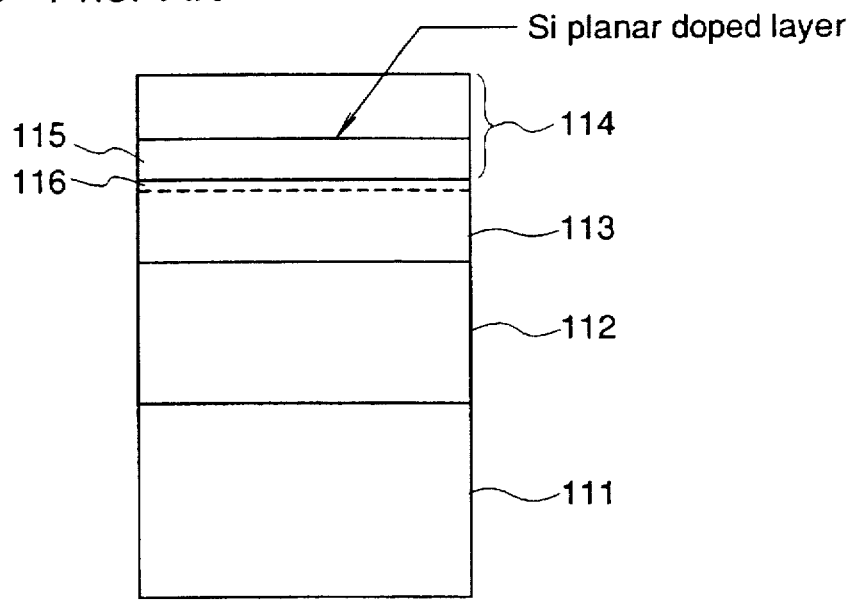
FIG. 6 is a cross-sectional view illustrating a semiconductor layer structure for explaining degradation of electrical characteristics of a semiconductor device due to heat treatment in a method of fabricating the semiconductor device according to the prior art.
Figure 7:
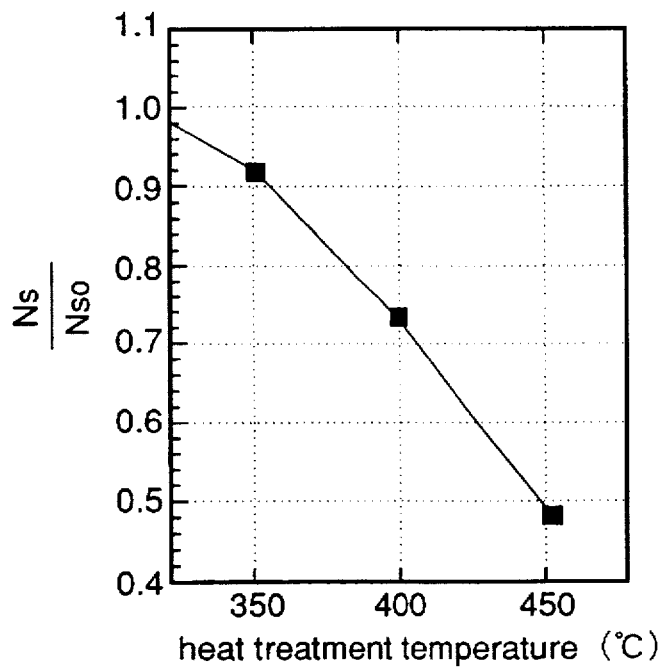
FIG. 7 is a graph showing the relationship between sheet carrier concentration and heat treatment temperature for explaining degradation of electrical characteristics of a semiconductor device due to heat treatment in a method of fabricating the semiconductor device according to the prior art.
Figure 8:
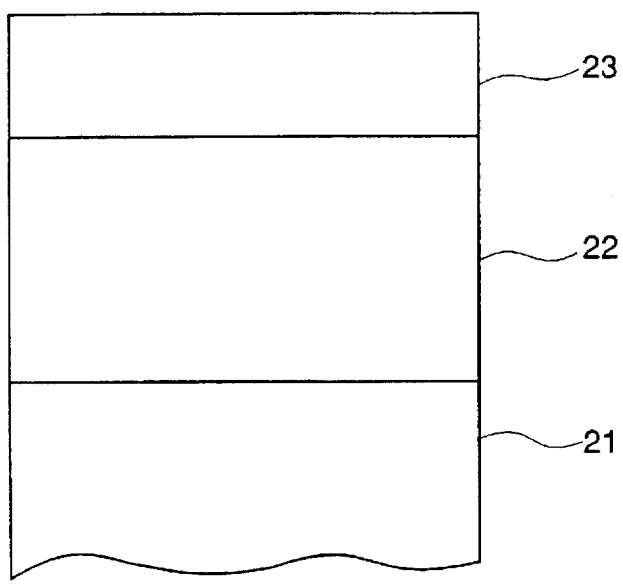
FIG. 8 is a cross-sectional view illustrating a semiconductor layer structure employed for explaining degradation of electrical characteristics of a semiconductor device due to heat treatment in a method of fabricating the semiconductor device according to the prior art.
Figure 9:
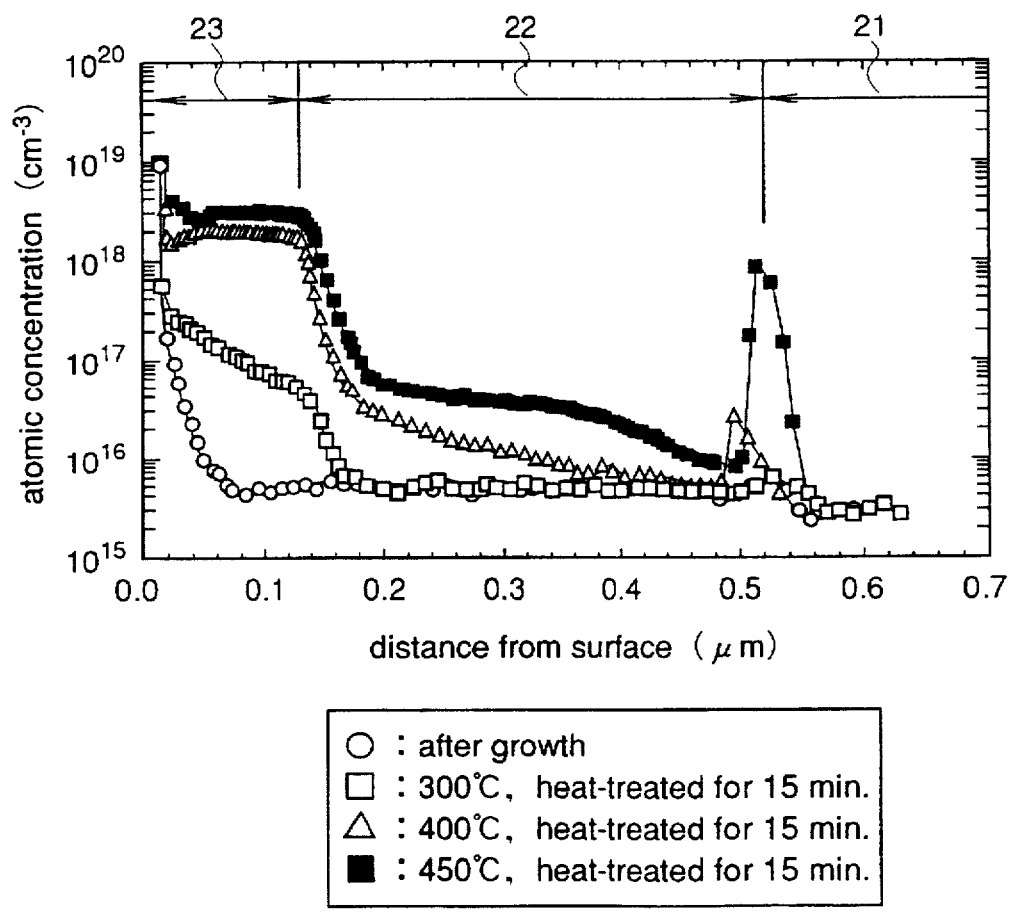
FIG. 9 is a graph showing a fluorine profile for explaining degradation of electrical characteristics of a semiconductor device due to heat treatment in a method of fabricating the semiconductor device according to the prior art.

In the HEMT according to the present invention, since the AlInAs electron supply layer 105 is connected through the spacer layer 104 to the InGaAs channel layer 103, a two-dimensional electron gas is produced in the channel layer 103 at the interface of the channel layer 103 and the spacer layer 104. The two-dimensional electron gas provides a high electron mobility in the channel layer 103, whereby the operating speed of the HEMT is significantly increased. Although the fundamental structure of the prior art HEMT shown in FIG. 5(a) is identical to the structure of the HEMT according to the invention, the prior HEMT has the following drawbacks caused by the fabrication process. That is, when the undoped InAlAs Schottky barrier formation layer 106 is exposed to the atmosphere, fluorine sticks to the surface of this layer and infiltrates the structure during subsequent heat treatment or operation of the HEMT. Since the fluorine is concentrated in the highly doped $n^+$ type InAlAs electron supply layer 105, the electron supply layer 105 is degraded and the carrier concentration in the two-dimensional electron gas is reduced. Therefore, the prior art method does not provide a highly reliable HEMT with desired characteristics.

In the HEMT according to the present invention, however, the fluorine on the surface of the undoped InAlAs Schottky barrier formation layer 106 exposed in the recess is completely removed in the $(NH_4)_2S$ or $(NH_4)_2S_x$ treatment and the vacuum annealing, and the protective film 3 is formed on the Schottky barrier formation layer 106 immediately after the removal of the fluorine. Therefore, no fluorine remains on the surface of the Schottky barrier formation layer 106, so that unwanted infiltration of fluorine into the $n^+$ type InAlAs electron supply layer 105 is avoided. In this HEMT, the $n^+$ type InAlAs electron supply layer 105 contains no fluorine, in other words, the quantity of fluorine in the electron supply layer 105 is less than the limit of measurement. Since the HEMT contains no fluorine, even when it is operated at a high temperature, thermal degradation, such as an increase in resistance, does not occur. As a result, a highly reliable HEMT with desired electrical characteristics is obtained.

Figure 10:
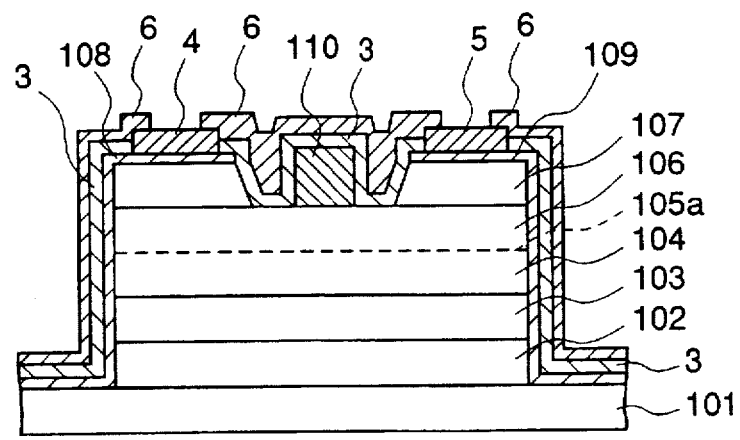
FIG. 10 is a cross-sectional view illustrating an HEMT according to a modification of the present invention.

FIG. 10 is a cross-sectional view illustrating an HEMT according to a modification of the present invention. In the figure, the same reference numerals as those shown in FIG. 1 designate the same or corresponding parts. In this modification, in place of the $n^+$ type InAlAs electron supply layer 105 of the HEMT shown in FIG. 1, an $n^+$ type planar doped layer 105a, that is, an $n^+$ type layer produced by two-dimensional doping with an impurity, such as Si, is employed as an electron supply layer. The $n^+$ type planar doped layer 105a is interposed between the undoped InAlAs spacer layer 104 and the undoped InAlAs Schottky barrier formation layer 106. Also in this case, the same effects as provided by the HEMT shown in FIG. 1 are obtained.

In the foregoing description, emphasis has been placed upon an HEMT employing an undoped InAlAs layer as a Schottky barrier formation layer to which fluorine sticks when exposed to the atmosphere and an $n^+$ type InAlAs layer as an electron supply layer. However, the present invention may be applied to other semiconductor devices including InAlAs layers, such as field effect transistors or laser diodes with the same effects as described above.

While in the HEMT according to the present invention an undoped InAlAs layer and an $n^+$ type InAlAs layer are employed for the Schottky barrier formation layer 106 and the electron supply layer 105, respectively, other semiconductor layers comprising a mixed crystal including AlAs and InAs may be employed for these layers. For example, the Schottky barrier formation layer 106 may comprise GaIn-AlAs. Also in this case, the same effects as described above are obtained.

Further, in the HEMT according to the invention, the semiconductor layer to which fluorine sticks when exposed to the atmosphere is an undoped InAlAs layer, and the fluorine is removed from the surface of this layer. However, the present invention can be applied to an HEMT in which the layer to which fluorine sticks is an impurity-doped InAlAs layer, with the same effects as described above.

Furthermore, in the method of fabricating an HEMT according to the present invention, the surface of the undoped InAlAs Schottky barrier formation layer 106 to which fluorine sticks is treated with $(NH_4)_2S$ or $(NH_4)_2S_x$. However, other solutions or gases containing a material that is easily combined with fluorine may be employed for the treatment of the surface of the Schottky barrier formation layer 106.

Figure 11:
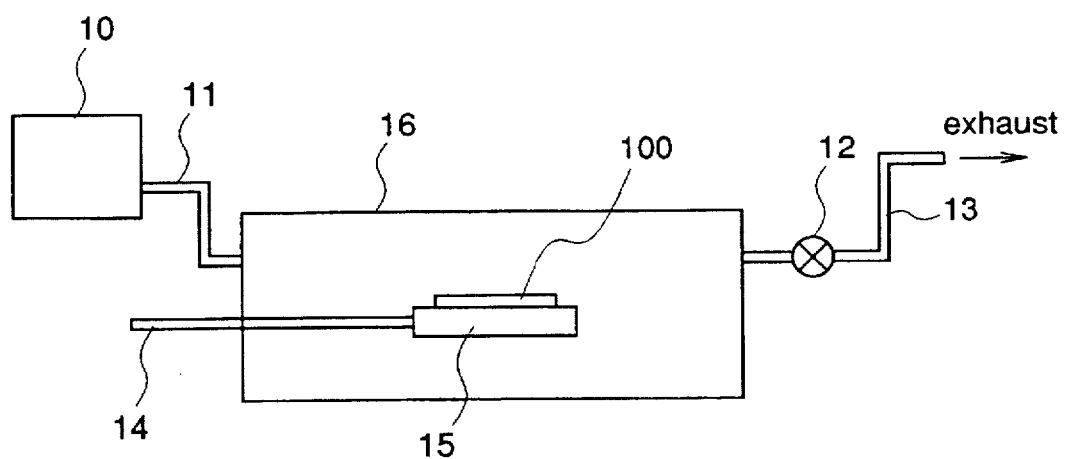
FIG. 11 is a schematic diagram illustrating an apparatus for fabricating a semiconductor device according to a modification of the present invention.

For example, a case where a gaseous compound including Si is employed for the treatment will be described. FIG. 11 is a schematic diagram showing an apparatus used for the treatment. In FIG. 11, a hermetically sealed quartz tube 16 contains a pedestal 15 for supporting a wafer. The pedestal 15 is supported by a rod 14. A bomb 10 filled with a gaseous compound including Si, such as silane $(SiH_4)$ or disilane $(Si_2H_6)$, is connected through a gas supply pipe 11 to the quartz tube 16. A pump 12 and a pipe 13 for exhausting the gaseous compound is connected to the quartz tube 16. Initially, a wafer 100 including a Schottky barrier formation layer that is exposed at the surface of the wafer is put on the pedestal 15 in the quartz tube 16. Then, the gaseous compound including Si is introduced into the quartz tube 16 and applied to the surface of the Schottky barrier formation layer, whereby Si combines with fluorine on the surface of the Schottky barrier formation layer and the bonding strength between the fluorine and the Schottky barrier formation layer is reduced. The fluorine is completely removed from the surface of the layer in the subsequent vacuum annealing. Alternatively, $H_2S$ gas may be employed for the gas treatment. In this case, S is combined with the fluorine on the surface of the Schottky barrier formation layer.

What is claimed is:

1. A semiconductor device comprising:

a compound semiconductor substrate;

an undoped channel layer disposed on the substrate;

an electron supply layer disposed on the channel layer, the electron supply layer comprising a mixed crystal semiconductor material comprising AlAs and InAs and, having a high concentration of a dopant impurity producing n type conductivity, and free of fluorine;

a Schottky barrier formation layer disposed on the electric supply layer, the Schottky barrier formation layer comprising an undoped mixed crystal semiconductor material comprising AlAs and InAs and free of fluorine;

an ohmic contact layer disposed on the Schottky barrier formation layer and having a high concentration of a dopant impurity producing n type conductivity;

a source electrode and a drain electrode on the ohmic contact layer;

a gate electrode disposed on a portion of the Schottky barrier formation layer between the source electrode and the drain electrode; and a protective film disposed on a portion of the Schottky barrier formation layer adjacent to the gate electrode and between the source electrode and the drain electrode.

2. The semiconductor device according to claim 1 wherein the protective film comprises a compound of silicon.

3. The semiconductor device according to claim 2 wherein the compound if silicon comprises SiON.

4. The semiconductor device according to claim 2 wherein the compound of silicon comprises SiN.

* * * * *